United States Patent
Han (10) Patent No.: US 9,547,344 B2
(45) Date of Patent: Jan. 17, 2017

(54) SUPPORT FRAME WITH INTEGRATED THERMAL MANAGEMENT FEATURES

(71) Applicant: Futurewei Technologies, Inc., Plano, TX (US)

(72) Inventor: Qian Han, San Diego, CA (US)

(73) Assignee: Futurewei Technologies, Inc., Plano, TX (US)

( * ) Notice: Subject to any disclaimer, the term of this patent is extended or adjusted under 35 U.S.C. 154(b) by 149 days.

(21) Appl. No.: 14/197,662

(22) Filed: Mar. 5, 2014

(65) Prior Publication Data

US 2015/0253823 A1 Sep. 10, 2015

(51) Int. Cl.
*G06F 1/20* (2006.01)
*H05K 7/20* (2006.01)
*G06F 1/16* (2006.01)

(52) U.S. Cl.
CPC ............. *G06F 1/203* (2013.01); *G06F 1/1656* (2013.01); *H05K 7/20336* (2013.01); *G06F 2200/201* (2013.01)

(58) Field of Classification Search
CPC .. B23P 15/26; B23P 2700/10; G01R 31/2874; G06F 1/203; H05K 7/20318; H05K 7/20327; H05K 7/20336; H05K 7/20409; H05K 7/20436
USPC ........... 165/185; 361/679.46, 679.52, 679.53
See application file for complete search history.

(56) References Cited

U.S. PATENT DOCUMENTS

| | | | | |
|---|---|---|---|---|
| 6,533,029 B1* | 3/2003 | Phillips | ................ | F28D 15/043 165/104.26 |
| 7,292,441 B2* | 11/2007 | Smalc | .................... | G06F 1/203 165/185 |
| 7,486,517 B2* | 2/2009 | Aapro | ................... | H04M 1/026 165/104.33 |
| 8,782,889 B2* | 7/2014 | Chen | ....................... | B22F 7/08 165/104.26 |
| 2002/0179288 A1* | 12/2002 | Ishida | .................. | B21C 37/151 165/104.26 |
| 2007/0263352 A1* | 11/2007 | Jones | ................. | H05K 7/20418 361/688 |
| 2011/0073284 A1* | 3/2011 | Yoo | ..................... | F28D 15/0266 165/104.26 |
| 2013/0327507 A1* | 12/2013 | Degner | .................. | G06F 1/203 165/120 |
| 2014/0166245 A1* | 6/2014 | Dai | .................... | H05K 7/20336 165/104.26 |
| 2014/0168874 A1* | 6/2014 | MacDonald | ........... | G06F 1/203 361/679.08 |

(Continued)

*Primary Examiner* — Michael Matey
(74) *Attorney, Agent, or Firm* — Schwegman Lundberg & Woessner, P.A.

(57) ABSTRACT

This invention describes a novel solution to providing heat redistribution and cooling to electronic devices. According to various embodiments, heat produced during the operation of the processing components in the computing device is absorbed by heat management features integrated within a supporting mid-frame. Liquid (e.g., coolants) contained in the portion of the heat management features most proximate to the processing components evaporates due to the absorbed heat, and is conducted (via convection) towards the other end of the heat management features, where the temperature is cooler. Once sufficiently cooled, the evaporated coolant condenses back into liquid form and flows back towards the other end of the heat management features.

14 Claims, 8 Drawing Sheets

(56) References Cited

U.S. PATENT DOCUMENTS

| | | | |
|---|---|---|---|
| 2014/0262160 A1* | 9/2014 | Vadakkanmaruveedu | F28D 15/02 165/104.33 |
| 2014/0262161 A1* | 9/2014 | Weigand ................ | G06F 1/203 165/104.33 |
| 2015/0055300 A1* | 2/2015 | Hsieh ....................... | G06F 1/20 361/700 |

* cited by examiner

SUPPORT FRAME WITH INTEGRATED THERMAL MANAGEMENT FEATURES

BACKGROUND OF THE INVENTION

The prevailing design methodology of mobile computing devices (such as smart phones, tablets devices, netbooks, personal data assistants, portable media devices, etc.) emphasizes slimmer profiles while offering ever increasing processing and image rendering capabilities and larger display sizes. As a natural result of minimizing the width or thickness of the underlying mobile computing devices, a similar trend of minimizing the height of the internal modules has developed out of necessity.

A common implementation of a mobile computing device includes a main printed circuit board (PCB) having one or more processing elements. The distinct lack of internal space due to the smaller form factor not only makes heat dissipation more critical, but also presents additional challenges for heat distribution and dispersal. A popular solution for managing heat levels in mobile computing devices is through the use of a series of heat sink and/or liquid cooling structures soldered using a solder paste or thermal interface material or otherwise adhered via an adhesive to a supporting panel positioned near the main PCB.

Figure 1:
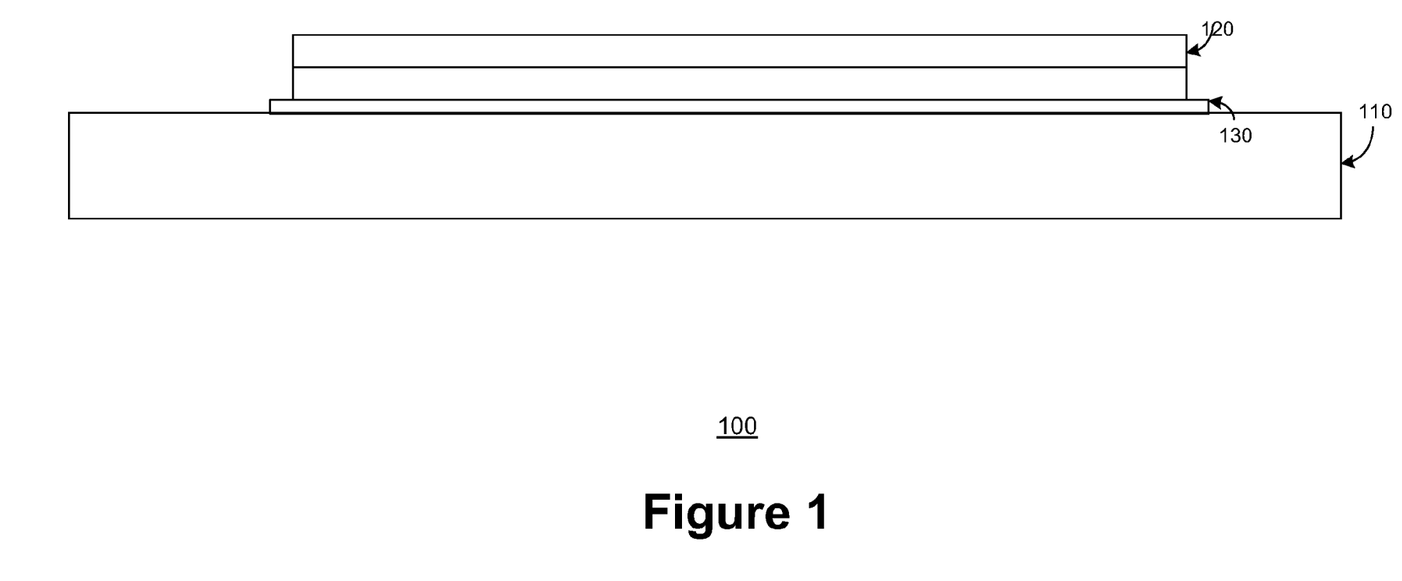
FIG. 1 depicts a conventional internal support structure for a mobile computing device with heat management features, in accordance with various embodiments of the present invention.

FIG. 1 depicts a side view of such a device. As depicted in FIG. 1, one or more structures for heat dispersal 120 are adhered to a support panel 110, via a solder or adhesive layer 130 on the surface of the support panel 110. As depicted in FIG. 1, the structures for heat disposal 120 typically protrude or extend beyond the vertical profile of the support structure 110. Unfortunately, conventional implementations such as these add to the thickness of the mobile devices by requiring additional space for the heat sink and/or liquid cooling structures. This clearly results in an obvious conflict with the goal of maintaining (or increasing) slimmer profiles for the mobile devices.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

An aspect of the present invention proposes a system for distributing and managing heat in a computing device using heat management features directly integrated within a support structure or panel. According to these embodiments, a support panel is provided with integrated heat management features as a single intrinsic structure, in contrast with conventional solutions that include heat transfer layers affixed over or on top of a support structure. The thermal conductivity of the support structure is improved through the integration of the heat management features, since the features will typically have significantly higher thermal conductivity than the composition of the underlying frame/support structure.

According to another aspect of the present claimed subject matter, a mobile consumer electronics device, such as a mobile phone or tablet, is provided with a mid-frame panel that provides structural and mechanical support to the device while also distributing generated heat evenly throughout the support panel or mid-frame of the computing device. According to these embodiments, heat produced during the operation of the processing components in the computing device is absorbed by heat management features integrated within the mid-frame. Liquid (e.g., coolants) contained in the portion of the heat management features most proximate to the processing components evaporates due to the absorbed heat, and is conducted (via convection) towards the other end of the heat management features, where the temperature is cooler. Once sufficiently cooled, the evaporated coolant condenses back into liquid form and flows back towards the other end of the heat management features due to diffusion/osmosis.

According to yet another aspect, a support panel is described with integrated thermal management features that includes a plurality of vapor chambers containing amounts of liquid coolant. In an embodiment, the support panel is implemented to include a metal frame with the thermal management features fully integrated with the panel as a single discrete and contiguous unit.

BRIEF DESCRIPTION OF THE DRAWINGS

The accompanying drawings are incorporated in and form a part of this specification. The drawings illustrate embodiments. Together with the description, the drawings serve to explain the principles of the embodiments.

DETAILED DESCRIPTION

Reference will now be made in detail to the preferred embodiments of the claimed subject matter, a method and system for the use of a reputation service provider, examples of which are illustrated in the accompanying drawings. While the claimed subject matter will be described in conjunction with the preferred embodiments, it will be understood that they are not intended to be limit to these embodiments. On the contrary, the claimed subject matter is intended to cover alternatives, modifications and equivalents, which may be included within the spirit and scope as defined by the appended claims.

Furthermore, in the following detailed descriptions of embodiments of the claimed subject matter, numerous specific details are set forth in order to provide a thorough understanding of the claimed subject matter. However, it will be recognized by one of ordinary skill in the art that the claimed subject matter may be practiced without these specific details. In other instances, well known methods, procedures, components, and circuits have not been described in detail as not to unnecessarily obscure aspects of the claimed subject matter.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer generated step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present claimed subject matter, discussions utilizing terms such as "storing," "creating," "protecting," "receiving," "encrypting," "decrypting," "destroying," or the like, refer to the action and processes of a computer system or integrated circuit, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Embodiments of the claimed subject matter are directed to solutions for providing heat dissipation and dispersal in computing devices by using heat management features integrated with a mid-frame support panel. By fully integrating the heat management features within the support panel, effective heat dissipation can be achieved while maintaining the slim profile often desirable for many consumer electronics.

Integrated Heat Pipes

Figure 2:
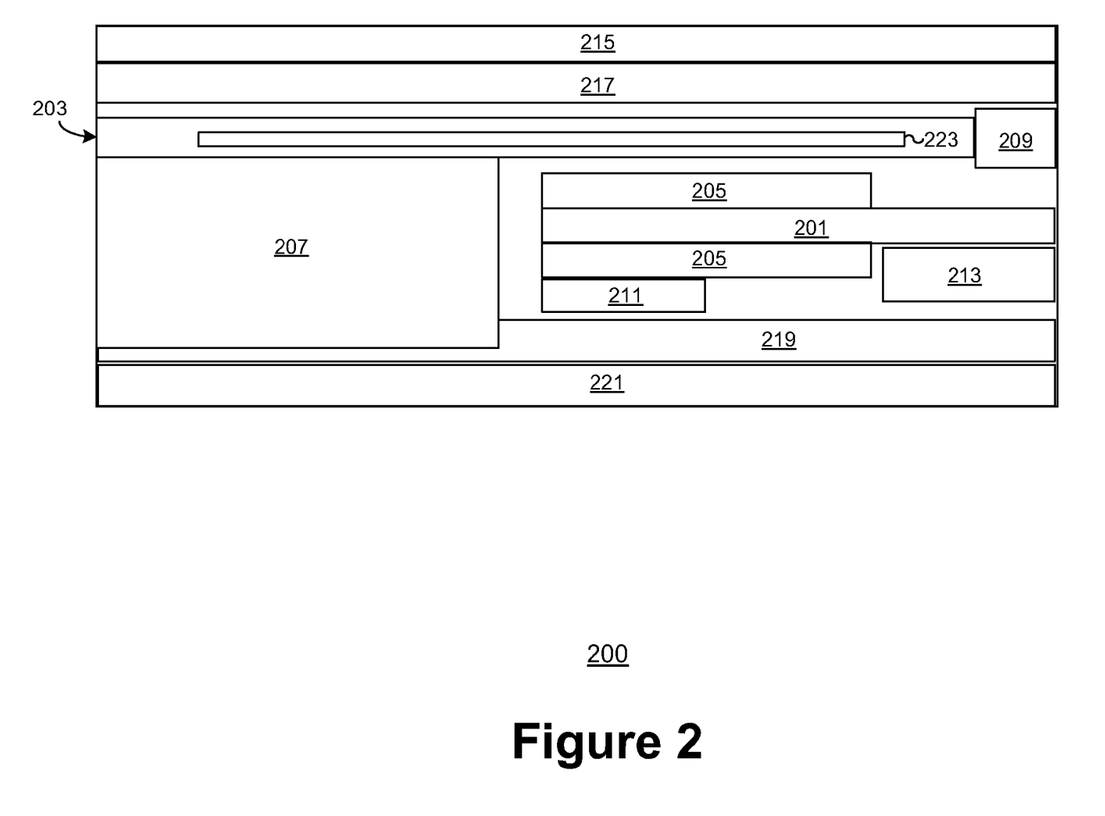
FIG. 2 depicts an exemplary component layer stack in a mobile computing device, in accordance with various embodiments of the present invention

FIG. 2 represents a profile of the component layers in a mobile computing device 200, according to embodiments of the claimed subject matter. The mobile computing device 200 may be implemented as, for example, a mobile phone, a tablet device, a netbook, a laptop device, a video game console, a personal data assistant, a media player, or any computing system or mobile computing device where heat is a concern, heat dissipation is an interest, and/or a slimmer profile may be desirable. As depicted in FIG. 2, a mobile computing device 200 includes a main printed circuit board (PCB) 201 that houses various components that collectively perform a significant portion (if not all) of the processing and rendering in the computing device. These components may include processors, including but not limited to: one or more central processing units (CPUs), one or more graphics processing units (GPUs), one or more application processors (APs, and one or more special purpose processors. According to further embodiments, these components may also include memory devices (flash memory, RAM) and power amplification devices.

According to one or more embodiments, the PCB 201 may be centrally positioned (with respect to height or thickness) within the mobile computing device 200, between a front panel (collectively including, for example, a sensor array layer 215 and display panel 217), and a back panel (collective including, for example, a back cover 219 and a battery cover 221). The sensor array layer 215 may also include a camera module consisting of one or more camera lens and shutter devices. Sensor array layer 215 may also comprise a two dimensional array of one or more sensor devices configured to detect touch gestures and contact. In one or more embodiments, the display panel 217 may be implemented as a liquid crystal display (LCD), for example. Mobile computing device 200 may also include a rechargeable power source such as a battery 207, positioned on or near the same vertical plane as the PCB, i.e., likewise positioned between the front and back panels.

According to some embodiments, the mobile computing device 200 may include one or more shield layers 205 configured to shield, obstruct, or block radio waves from reaching the components of the PCB 201. Other components of the mobile computing device 200 may include a second, alternate, or supplementary "flex" PCB 209 for additional processing, rendering, or memory storage, a speaker module 213, and a subscriber identity module (SIM) card reader 211 used for identification of subscribers in certain cellular data networks.

As depicted in FIG. 2, a mobile computing device 200 also includes a mid-frame 203 that provides mechanical and structural support for the mobile computing device 200. Mid-frame 203 may be implemented as, for example, a metal frame consisting of a rigid metal or metallic alloy material. According to embodiments of the claimed subject matter, one or more heat management structures 223 are intrinsically integrated within the mid-frame 203. The heat management structures 223 may be implemented as, for example, one or more heat pipes, one or more heat sinks, and/or one or more vapor chambers that are operable to absorb heat produced by proximate processing components (of a PCB for example) and redistribute/dissipate the heat across the length of the mid-frame 203.

In one or more embodiments, the heat management structures 223 are entirely integrated within the mid-frame 203 such that no portion of the heat management structures 223 extends or protrudes beyond the dimensions of the mid-frame structure 203, thereby providing heat management capability without compromising the profile of the mobile computing device. In further embodiments, the heat management structures 223 may be implemented from copper or aluminum, or any other metal or metallic alloy with high thermal conductivity. According to these embodiments, the thermal conductivity of the supporting mid-frame 203 is improved via the complete integration of the heat management structure 223 relative to conventional techniques that include one or more vertically stacked structures of heat management elements affixed over (or beneath) a support structure since the heat management structures 223 will typically have higher thermal conductivity than the composition of the frame/support structure. Moreover, embodiments of the presently claimed subject matter are able to maintain the same vertical profile as just the frame itself. In some embodiments, this may result in a reduction of approximately one-third of the height of the stacked structure (e.g., from 0.9 mm to 0.6 mm). Other advantages include a shorter thermal transfer path from the PCB to the mid-frame by eliminating the thermal resistance of the solder or thermal adhesive. An additional benefit to such an implementation can be realized during assembly and testing since the risk of the heat management structures being peeled or scraped off during assembly, testing, and/or real application can be avoided.

Figure 3:
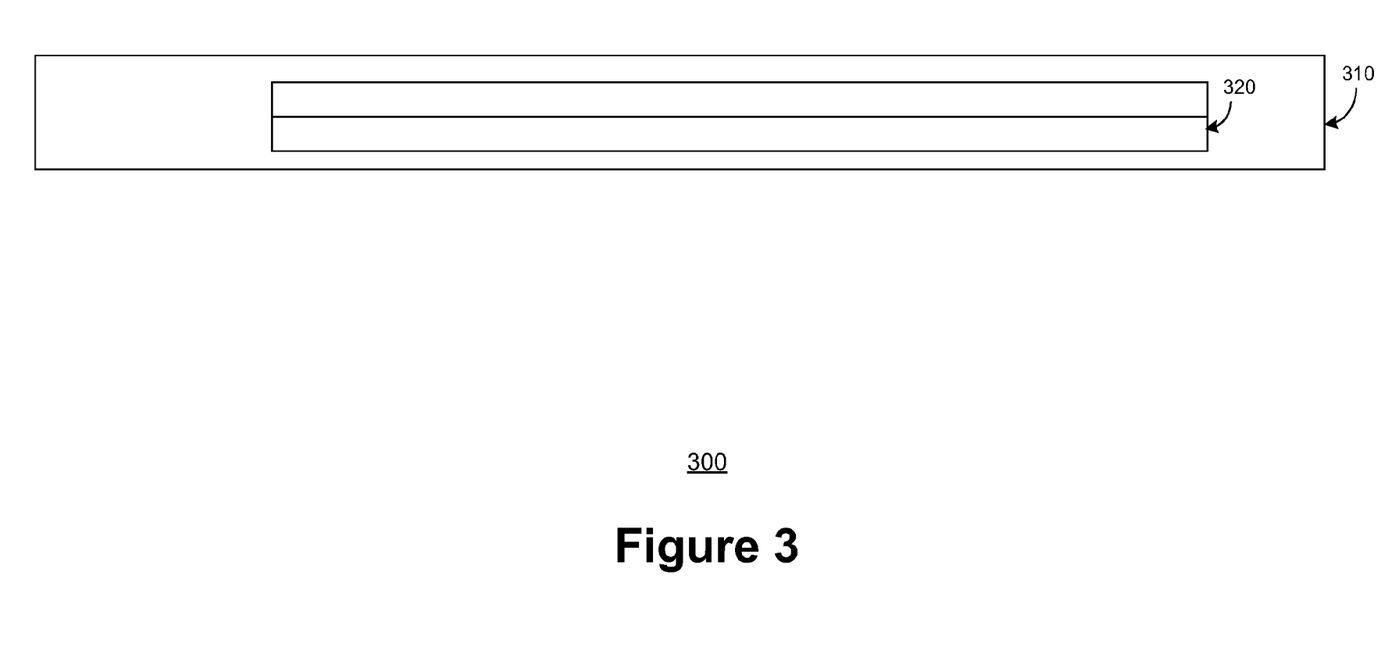
FIG. 3 depicts a side view of an exemplary mid-frame in a mobile computing device with integrated heat management features, in accordance with various embodiments of the present invention.

FIG. 3 depicts a side view 300 of an exemplary mid-frame 310 in a mobile computing device with integrated heat management features 320, in accordance with various embodiments of the present invention. The mid-frame 310 and heat management features 320 correspond to the mid-frame structure 203 and heat management structures 223 described above with respect to FIG. 2. As depicted in FIG. 3, the heat management features 320 may be integrated entirely within the dimensional constraints of the mid-frame 310, in contrast to conventional solutions.

Figure 4:
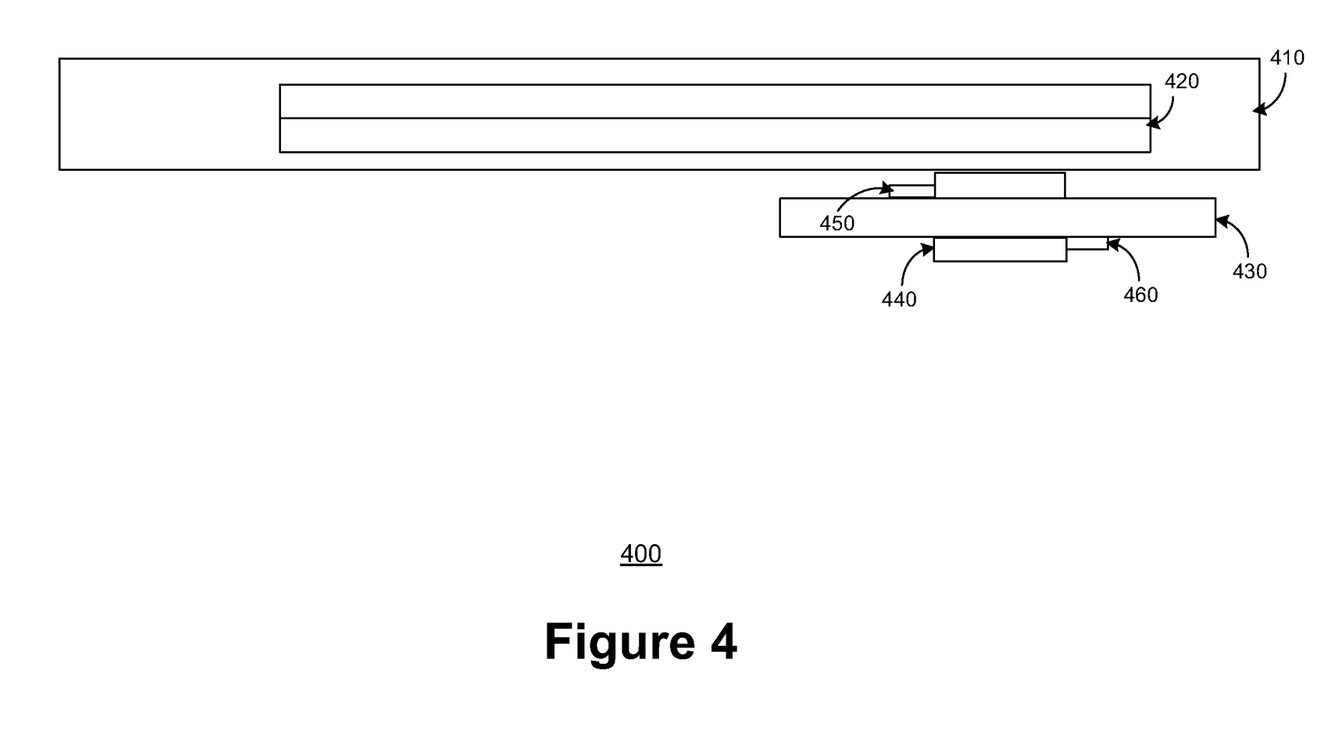
FIG. 4 depicts a side view of an exemplary mid-frame with integrated heat management features and a printed circuit board in a mobile computing device, in accordance with various embodiments of the present invention.

FIG. 4 depicts a side view 400 of an exemplary mid-frame 410 with integrated heat management features 420 and a printed circuit board 430 in a mobile computing device, in accordance with various embodiments of the present invention. Mid-frame 410 and integrated heat management features 420 correspond to similarly numbered elements in FIG. 3. As depicted in FIG. 4, the integrated heat management features 420 consists of one or more heat pipes. PCB 430 may be positioned directly beneath (or with an intervening shield layer) one end or portion of the mid-frame 410 and a corresponding end/portion of the heat pipes 420. Heat produced by the components of the PCB 430 (e.g., processors 440, 450, flash memory device 460) radiate from the PCB 430 and are absorbed by the mid-frame 410 and distributed by the integrated heat pipes 420 to other cooler portions of the mid-frame 410.

Figure 5:
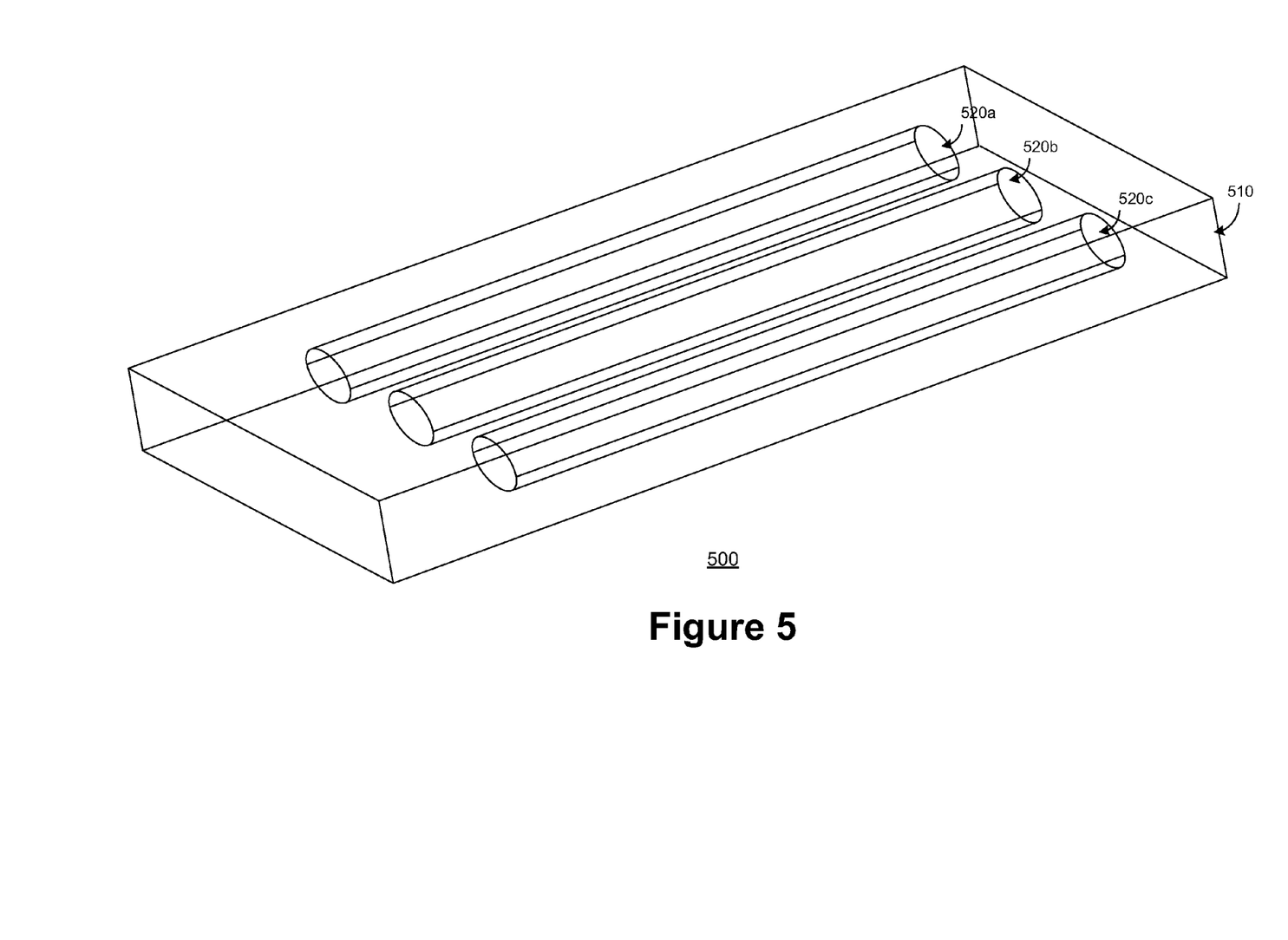
FIG. 5 depicts a three-dimensional view of an exemplary mid-frame in a mobile computing device with integrated heat management features, in accordance with various embodiments of the present invention.

FIG. 5 depicts a three-dimensional view 500 of an exemplary mid-frame 510 in a mobile computing device with integrated heat management features 520a, 520b, 520c, in accordance with various embodiments of the present invention. As depicted in FIG. 5, the integrated heat management features 520 consists of three embedded, parallel heat pipes arranged in parallel across the length of the mid-frame 510. While depicted in such a configuration, it is to be understood that the integrated heat management features are well suited to being arranged in varying other configurations (see FIGS. 7a-7d), depending on the layout and/or alignment of the PCB or other heat producing components in a computing device.

Figure 6A:
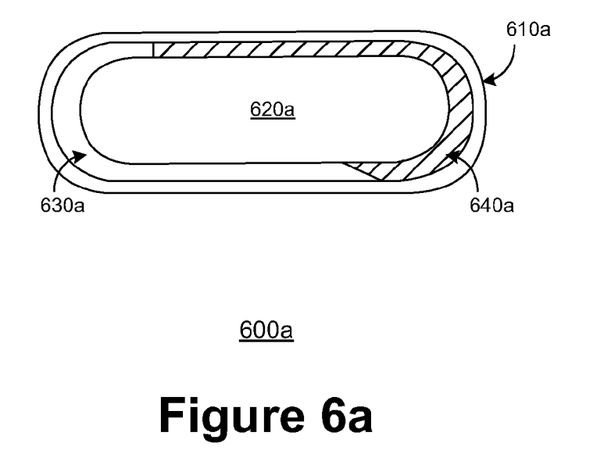
FIG. 6a depicts a cross-sectional view of a first exemplary heat management structure integrated in a mobile computing device, in accordance with various embodiments of the present invention.

FIG. 6a depicts a cross-sectional view 600a of a first exemplary heat management structure 610a in a mobile computing device, in accordance with various embodiments of the present invention. As depicted in FIG. 6a, the heat management structure 610a may include a vapor chamber 620a containing a liquid coolant (such as deionized water for example). As described above, the vapor chamber 620a is configured to facilitate the redistribution of heat via evaporation, conduction, condensation, and return of the liquid coolant in the chamber due to absorbed heat radiated from proximate computing components. In one or more embodiments, the heat management structure 610a may (but not necessarily) include a wick structure 640a, sintering powder 630a, or any other additional features designed to cover identified hot spots and to more effectively distribute heat into cooler areas of the heat pipe 610a and a mid-frame, respectively. In one embodiment, the wick structure 640a may include one or more grooves or a grooved portion. In still further embodiments, the wick structure may (but not necessarily) consist of the same material as the metal frame of the mid-frame. In alternate embodiments, the wick structure 640a consists of a different material (i.e., a material with less rigidity) than the mid-frame.

Figure 6B:
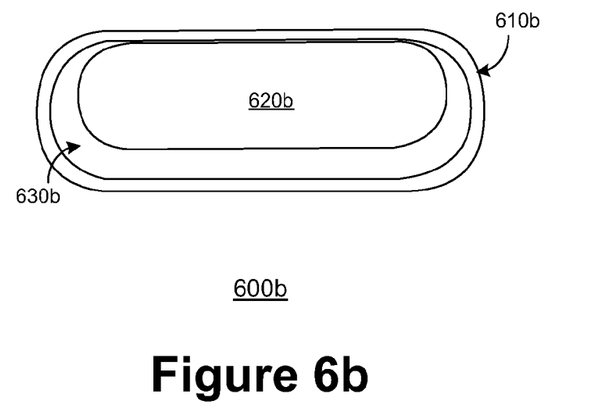
FIG. 6b depicts a cross-sectional view of a second exemplary heat management structure integrated in a mobile computing device, in accordance with various embodiments of the present invention.

FIG. 6b depicts a cross-sectional view 600b of a second exemplary heat management structure 610b in a mobile computing device, in accordance with various embodiments of the present invention. As depicted in FIG. 6b, the heat management structure 610b may include a vapor chamber 620b, such as the vapor chamber 620a in FIG. 6a. As described above, the vapor chamber 620b is configured to facilitate the redistribution of heat via evaporation, conduction, condensation, and return of the liquid coolant in the chamber due to absorbed heat radiated from proximate computing components. As depicted in FIG. 6b, the heat management structure 610b does not include the wick structure of FIG. 6a. Instead, the chamber with sintering powder 630b may be enlarged (relatively) or the overall diameter of the heat management structures 610b may be reduced.

Figure 7A:
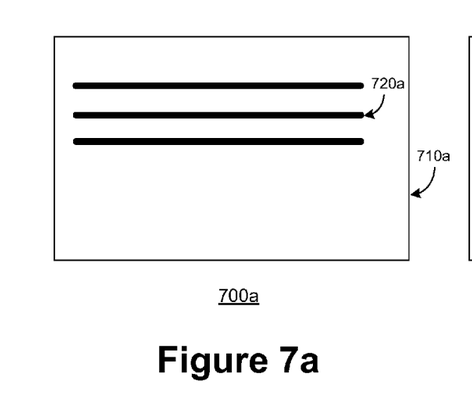
FIG. 7a depicts a first exemplary configuration of an integrated plurality of heat management structures in a mid-frame of a mobile computing device, in accordance with various embodiments of the present invention.

FIG. 7a depicts a first exemplary configuration 700a of an integrated plurality of heat management structures 720a in a mid-frame 710a of a mobile computing device, in accordance with various embodiments of the present invention. As depicted in FIG. 7a, the heat management structures 720a (which may comprise one or more embedded heat pipes, vapor chambers, heat sink structures, or a combination of these structures) can be arranged in parallel across the length of the mid-frame 710a.

Figure 7B:
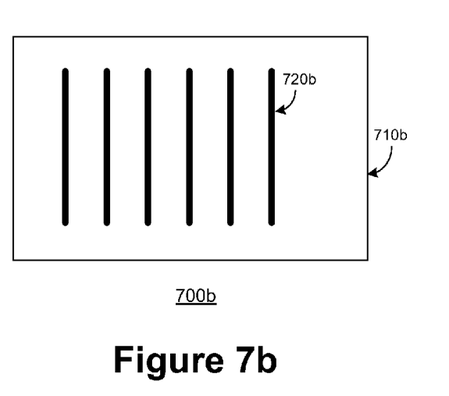
FIG. 7b depicts a second exemplary configuration of an integrated plurality of heat management structures in a mid-frame of a mobile computing device, in accordance with various embodiments of the present invention.

FIG. 7b depicts a second exemplary configuration 700b of an integrated plurality of heat management structures 720b in a mid-frame 710b of a mobile computing device, in accordance with various embodiments of the present invention. As depicted in FIG. 7b, the heat management structures 720b (which may comprise one or more heat pipes, vapor chambers, heat sink structures, or a combination of these structures) can be arranged in parallel but perpendicular relative to the length of the mid-frame 710b.

Figure 7C:
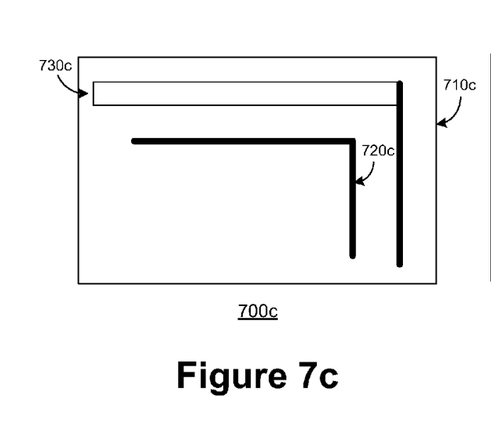
FIG. 7c depicts a third exemplary configuration of an integrated plurality of heat management structures in a mid-frame of a mobile computing device, in accordance with various embodiments of the present invention.

FIG. 7c depicts a third exemplary configuration 700c of an integrated plurality of heat management structures 720c, 730c in a mid-frame 710c of a mobile computing device, in accordance with various embodiments of the present invention. As depicted in FIG. 7c, the heat management structures may comprise one or more heat pipes 720c in combination with a single vapor chamber 730c arranged at right angles and configured to correspond to hot spots and/or the layout of the heat producing components in the underlying PCB.

Figure 7D:
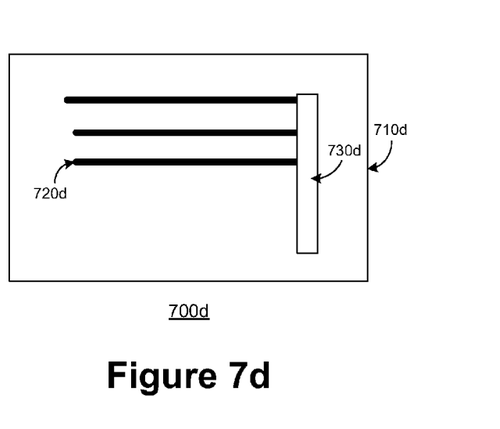
FIG. 7d depicts a fourth exemplary configuration of an integrated plurality of heat management structures in a mid-frame of a mobile computing device, in accordance with various embodiments of the present invention.

FIG. 7d depicts a fourth exemplary configuration 700d of an integrated plurality of heat management structures 720d, 730d in a mid-frame 710d of a mobile computing device, in accordance with various embodiments of the present invention. As depicted in FIG. 7d, the heat management structures may comprise multiple heat pipes 720c arranged in parallel and affixed to a single vapor chamber 730c arranged at a right angle and configured to correspond to hot spots and/or the layout of the heat producing components in the underlying PCB. While multiple configurations have been depicted in FIGS. 7a-7d, it is to be understood that these configurations are exemplary and that embodiments of the claimed subject matter are in no way limited to the specific configurations depicted.

Figure 8:
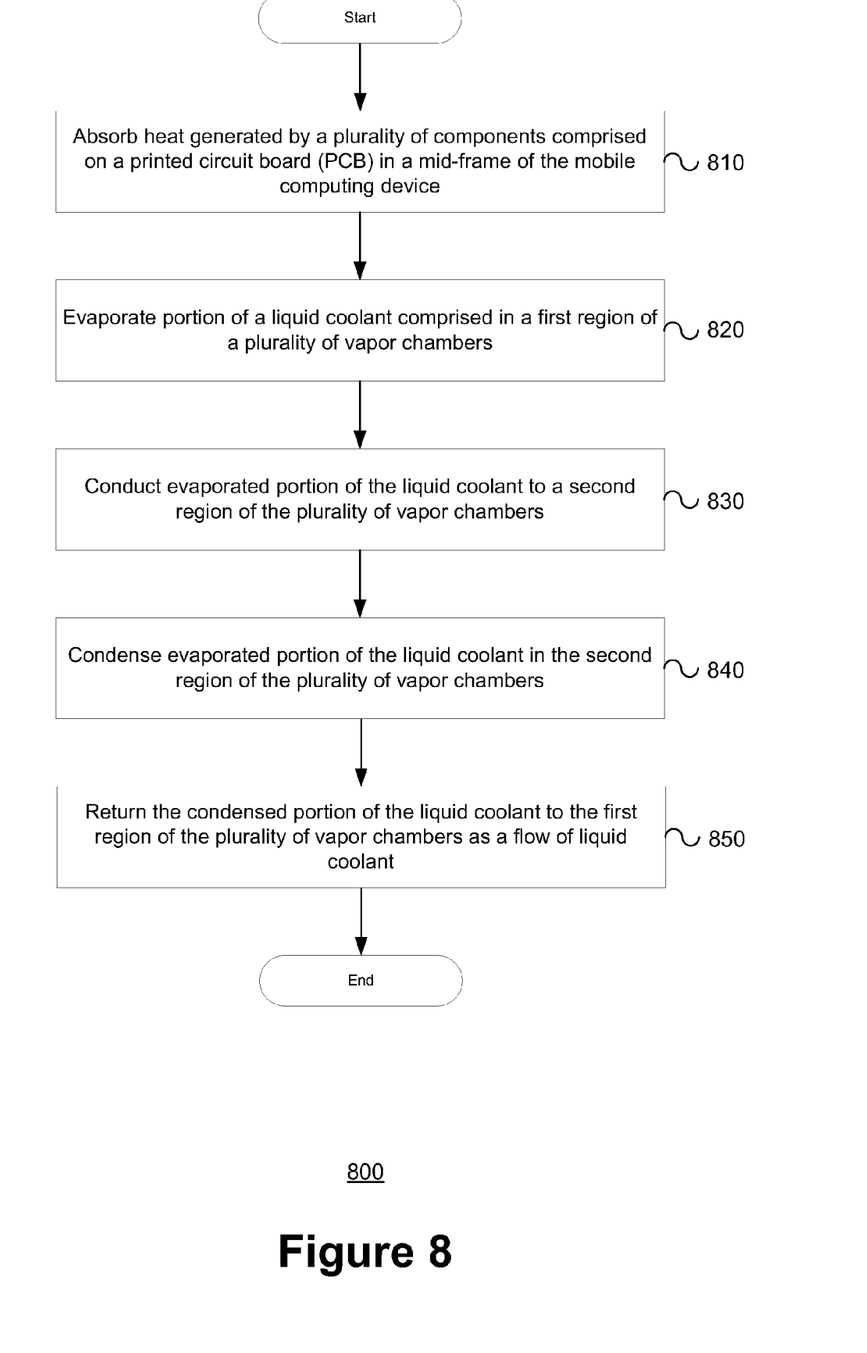
FIG. 8 depicts a flowchart of dissipating heat using heat management structures in a mid-frame of a mobile computing device, in accordance with various embodiments of the present invention.

FIG. 8 depicts a flowchart 800 of dissipating heat using heat management structures integrated within a mid-frame of a mobile computing device, in accordance with various embodiments of the present invention. Steps 810-850 describe exemplary steps of the flowchart 800 in accordance with the various embodiments herein described.

In one or more embodiments, heat produced during the operation of a mobile computing device (e.g., the processing components of a main PCB) is absorbed at step 810 by heat management structures integrated or otherwise completely embedded in a mid-frame support panel. At step 820, liquid (e.g., coolants) contained in the portion of the heat management structures most proximate to the heat source (PCB) evaporates due to the absorbed heat, and at step 830 is conducted (via convection) towards the other end of the integrated heat management structures, where the temperature is cooler due to the greater distance from the heat source(s). Once sufficiently cooled, the evaporated coolant condenses back into liquid form at step 840 and flows back towards the other (original) end of the heat management structures at step 850 due to capillary action or wicking, after which steps 810-850 may be repeated. By providing heat management capabilities completely integrated within a standard sized support frame, heat dispersal and redistribution can be improved while reducing size requirements and the number of discrete components in computing devices relative to conventional implementations.

In the foregoing specification, embodiments have been described with reference to numerous specific details that may vary from implementation to implementation. Thus, the sole and exclusive indicator of what is the invention, and is intended by the applicant to be the invention, is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A mobile computing device, comprising:
    a front panel comprising a display panel;
    a back panel;
    a mid-frame comprising a plurality of integrated thermal management structures encased by the mid-frame, the mid-frame being configured to provide mechanical support for the mobile computing device and disposed between the front panel and the back panel; and
    a printed circuit board (PCB) disposed between at least a portion of the front panel and at least a portion of the mid-frame, the PCB comprising a plurality of components including at least one processor, wherein the plurality of integrated thermal management structures comprise:
    a plurality of vapor chambers each surrounded by a respective chamber configured to contain at least one of a sintering powder or a wick structure having a plurality of grooves such that the at least one of the sintering powder or the wick structure contact a respective exterior portion of each of the vapor chambers;
    a first region of the mid-frame configured to be proximate to a heat source; and
    a second region of the mid-frame, wherein the mid-frame is configured to contain a liquid coolant, wherein the mid-frame is configured for a portion of the liquid coolant evaporated by heat absorbed from the heat source to be condensed in the second region of the mid-frame, wherein the mid-frame is further configured for a condensed portion of the liquid coolant to flow from the second region of the mid-frame to the first region of the mid-frame.

2. The mobile computing device according to claim 1, wherein the mobile computing device comprises at least one device from the group consisting of:
    a smart phone;
    a tablet;
    a personal data assistant;
    a video game console;
    a netbook;
    a laptop computer; and
    a portable media player.

3. The mobile computing device according to claim 1, wherein the plurality of components comprises at least one component from the group consisting of:
    a central processing unit (CPU);
    a graphics processing unit (GPU);
    an application processor (AP);
    a flash memory device; and
    a power amplifier device.

4. The mobile computing device of claim 1, wherein a plurality of thermal management structures are configured such that the condensed portion of the liquid coolant flows from the second region of the mid-frame to the first region of the mid-frame once the liquid condenses due to capillary action caused by the wick structure of the plurality of thermal management structures.

5. The mobile computing device of claim 4, wherein the first region of the mid-frame is operable to have a higher temperature than the second region of the mid-frame.

6. The mobile computing device of claim 4, wherein the first region of the mid-frame is disposed in a portion of the mid-frame with a greater proximity to the PCB than the second region of the mid-frame.

7. The mobile computing device of claim 1, wherein the liquid coolant comprises deionized water.

8. The mobile computing device of claim 1, wherein the plurality of thermal management structures are comprised of a material with high thermal conductivity.

9. The mobile computing device of claim 1, wherein the mid-frame comprises a metal frame.

10. The mobile computing device of claim 9, wherein the wick structure is comprised of a different material than the metal frame comprising the mid-frame.

11. The mobile computing device of claim 9, wherein the wick structure is comprised of the same material as the metal frame comprising the mid-frame.

12. A mobile computing device comprising:
a front panel comprising a lens device and a display panel;
a back panel;
a mid-frame disposed between the front panel and the back panel, the mid-frame comprising a plurality of integrated heat pipes and being configured to provide mechanical support for the mobile computing device, wherein the plurality of integrated heat pipes are encased within the mid-frame and comprise a plurality of vapor chambers, each vapor chamber surrounded by a chamber configured to contain a sintering powder that contacts an exterior of the vapor chamber;
a battery disposed between at least a portion of the mid-frame and at least a portion of the back panel;
a plurality of shield layers disposed between a second portion of the mid-frame and a second portion of the back panel;
a printed circuit board (PCB) disposed between the plurality of shield layers, the PCB comprising a plurality of components including at least one processor;
a back cover disposed between the second portion of the back panel and the PCB.

13. The mobile computing device of claim 12, wherein the plurality of vapor chambers are configured to redistribute heat produced by the plurality of the components of the PCB by causing a portion of a coolant comprised the plurality of vapor chambers to:
evaporate in a portion of the plurality of vapor chambers having a higher temperature;
condense in a portion of the plurality of vapor chambers having a lower temperature; and
flow back to the first portion of the plurality of vapor chambers as a condensed liquid.

14. An apparatus for providing thermal management, the apparatus comprising:
a metal frame configured to provide mechanical support;
a plurality of thermal management structures integrated within an interior of the metal frame, wherein the plurality of thermal management structures comprise:
a plurality of vapor chambers each surrounded by a respective chamber configured to contain at least one of a sintering powder or a wick structure having a plurality of grooves such that the at least one of the sintering powder or the wick structure contact a respective exterior portion of each of the vapor chambers;
a first region of the metal frame configured to be proximate to a heat source; and
a second region of the metal frame, wherein the metal frame is configured to contain a liquid coolant, wherein the metal frame is configured for a portion of the liquid coolant is evaporated by heat absorbed from the heat source to be condensed in the second region of the metal frame, wherein the metal frame is further configured for a condensed portion of the liquid coolant to flow from the second region of the metal frame to the first region of the metal frame.

* * * * *